United States Patent
Sugano et al.

(10) Patent No.: US 7,378,228 B2
(45) Date of Patent: May 27, 2008

(54) POSITIVE TYPE PHOTOSENSITIVE EPOXY RESIN COMPOSITION AND PRINTED CIRCUIT BOARD USING THE SAME

(75) Inventors: Yasuaki Sugano, Hyogo (JP); Yasuharu Nojima, Osaka (JP)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 0 days.

(21) Appl. No.: 11/471,871

(22) Filed: Jun. 21, 2006

(65) Prior Publication Data

US 2006/0240356 A1    Oct. 26, 2006

Related U.S. Application Data

(63) Continuation of application No. 10/416,978, filed as application No. PCT/EP01/12819 on Nov. 6, 2001, now Pat. No. 7,097,958.

(30) Foreign Application Priority Data

Nov. 15, 2000   (EP)   ................................. 00811080

(51) Int. Cl.
*G03F 7/40*   (2006.01)
(52) U.S. Cl. ...................... 430/315; 430/12; 430/280.1
(58) Field of Classification Search ................ 430/315, 430/12

See application file for complete search history.

(56) References Cited

U.S. PATENT DOCUMENTS 4,556,628 A * 12/1985 Greschner et al. .......... 430/314

FOREIGN PATENT DOCUMENTS

| EP | 0933681 A1 * | 8/1999 |
| KR | 1998-013546 | 4/1998 |

* cited by examiner

*Primary Examiner*—Cynthia Hamilton

(57) ABSTRACT

A printed circuit board comprising an insulating layer prepared with the aid of a positive type photosensitive epoxy resin composition comprising (a) an epoxy resin having two or more epoxy groups in one molecule; (b) a modified phenolic resin having a triazine ring, (c) a latent basic curing agent, and (d) a photosensitive acid generator.

3 Claims, No Drawings

POSITIVE TYPE PHOTOSENSITIVE EPOXY RESIN COMPOSITION AND PRINTED CIRCUIT BOARD USING THE SAME

This application is a continuation application of U.S. patent application Ser. No. 10/416,978, filed May 15, 2003, now U.S. Pat. No. 7,097,958 which was the National Phase of International Application PCT/EP01/12819 filed Nov. 6, 2002 which designated the U.S. and which claimed priority to European (EP) Pat. App. No. 00811080.1 filed Nov. 15, 2000.

The present invention relates to a positive type photosensitive epoxy resin composition successfully usable as an insulating layer in a printed circuit board, for instance as a solder resist layer or, particularly as an interlaminar insulating layer in a multilayered printed circuit board of buildup mode in which conductor circuit layers and interlaminar insulating layers are piled up alternately; and a method for producing a multilayered printed circuit board of buildup mode using said epoxy resin composition.

The desire of the time for the size and enhancing the performance of electronic devices has promoted various rapid progresses in the field of mounting substrate, such as making thinner the wiring of multilayered printed circuit board in which substrate circuits are formed into a multi-layered structure, increasing the number of layers and enhancing the density of wiring. As its result, prior multi-layered wiring boards in which the wiring layers are connected by through-holes have become incapable of coping with the desire for enhancing the wiring density because of the large area occupied by through-holes. For such a reason, multilayered circuit board of buildup mode is actively studied in the recent years. In a multilayered printed circuit board of buildup mode, the wiring layers are connected one another through minute holes called "via holes".

As the interlaminar insulating layer thereof, epoxy resin compositions are used because of excellent electrical properties and adhesive properties of the compositions and excellent mechanical properties of the cured products thereof.

In addition, an interlaminar insulating layer is required to be flame-retarded from the viewpoint of safety, as typified by glass fiber-reinforced epoxy printed circuit boards, and they are flame-retarded by the use of halides (an example thereof is the brominated epoxy resin) or antimony compounds. In the recent years, however, the official regulation on the materials using halides such as bromides and the like and antimony compounds is becoming severer. In view of such a state of things, thermosetting interlaminar insulating layers using a triazine ring-containing epoxy resin as a curing agent for epoxy resin have been proposed (JP-A 11-87927, 11-1547, and 11-343398).

A buildup multilayered printed circuit board of photo-via mode using a photosensitive resin as interlaminar insulating layers on which via holes are formed by the photolithographic method has also been proposed. A buildup multilayered printed circuit board of photo-via type can decrease the diameter of via-holes, so that the area occupied by through-holes can be lessened to a great extent and, at the same time, many via-holes can be formed at once. Examples thereof include the negative type photosensitive resin compositions constituted of epoxy acrylate and epoxy resin (JP-A 9-40751, 10-36682, 10-173336); the negative type photosensitive resin compositions which are cured by the use of epoxy resin, novolac type epoxy resin and acrylate (JP-A 11-30855); the negative type photosensitive resin compositions in which an epoxy resin and a resol type phenolic resin are cured with a cationic photo-initiator (JP-A 5-136575); and the negative type photosensitive resin compositions composed mainly of a chalcone-containing bisphenol-epichlorohydrin type epoxy resin (JP-A 8-236945).

The above-mentioned interlaminar insulating layer using a triazine ring-containing phenolic compound as a curing agent for epoxy resin can achieve flame-retardation without use of brominated epoxy resin. However, this type of compositions are thermosetting, so that via-holes can be formed only by heat-curing the composition and thereafter forming the holes one by one by means of carbon dioxide laser. It takes a long period of time to produce a printed circuit board having a number of via-holes by such a method.

Further, prior epoxy resin compositions having photosensitivity have been difficult to flame-retard without use of brominated epoxy resin. Further, the above-mentioned photosensitive resin compositions are of negative type in which an area exposed to active energy beam cures and the unexposed area is removed by the process of development Accordingly, the active energy beam is absorbed into resin and diffused at the time of exposure and the extent of cure differs with depth of interlaminar layer, due to which the via holes formed by development assume an inversely tapered shape. This can deteriorate the throwing power in the subsequent copper-plating step and thereby cause a defective connection.

In view of the above, it is an object of the present invention to provide a positive type photosensitive epoxy resin composition which makes it possible to realize flame-retardation without use of brominated epoxy resin and, at the same time, to form regularly tapered via-holes by a lithographic method in which the exposed area is removed by the procedure of development.

In order to achieve the object mentioned above, the present invention provides a flame-retardant positive type photosensitive epoxy resin composition comprising (a) an epoxy resin having two or more epoxy groups in one molecule, (b) a modified phenolic resin having a triazine ring, (c) a basic curing agent and (d) a photosensitive acid generator as essential ingredients from which an area exposed to active energy beam can be eliminated by a procedure of development; a method for forming an insulating layer using said epoxy resin composition and a printed circuit layer board comprising such an insulating layer, in particular a multilayered printed circuit board of buildup mode comprising at least one of said insulating layers as interlaminar layer.

The ingredients constituting the positive type photosensitive epoxy resin composition of the present invention will be explained below.

The epoxy resin used in the present invention can be obtained by a known process which comprises reacting a divalent or polyvalent, mononuclear or polynuclear phenol compound with epichlorohydrin in the presence of an alkaline catalyst.

As the divalent phenol compound, for example, the following can be referred to: resorcinol, hydroquinone, pyrocatechin, 1,4-dihydroxy-2,5-tert-butyl-benzene, 1,4-dihydroxynaphthalene, 4,4'-dihydroxy-biphenyl, 4,4'-dihydroxy-3,3',5,5'-tetramethylbiphenyl, Bisphenol F, 1,1-bis(4-hydroxyphenyl)ethane, Bisphenol A, bis(4-hydroxyphenyl)-methylphenyl-methane, bis(4-hydroxyphenyl)-tolyl-methane, 1,1-bis(4-hydroxyphenyl)cyclohexane, bis(4-hydroxyphenyl)dicyclopentane, bis(4-hydroxy-3,5-dimethylphenyl)dicyclopentane, 4-[1-[4-(4-hydroxy-3-methylphenyl)-4-methylcyclohexyl]-1-methylethyl]-2- methylphenol, 4,4'-(9H-fluoren-9-ylidene)bisphenol, 4,4'-dihydroxybenzophenone, bis(4-hydroxyphenyl) sulfone, bis(4-hydroxyphenyl) sulfide, bis(4-hydroxy-3,5-dimethylphenyl)methane, 2,2-bis(4-hydroxy-3,5-dimethylphenyl)propane, 4,4'-[1,3-phenylenebis(1-methylethylidene)]-2,2',6,6'-bisphenol, 4,4'-[1,4-phenylenebis(1-methylethylidene)]-2,2',6,6'-bisphenol and bis(4-hydroxy-3,5-dimethylphenyl)methane.

As the trisphenols which belong to polyphenol compounds, 4,4',4"-methylidyne-trisphenol, 4,4',4"-ethylidyne-trisphenol and 4,4'-[1-4[2(4-hydroxyphenyl)-2-propyl]phenyl]ethylidene]bisphenol can be referred to.

As the tetrakisphenol which belong to polyphenol compounds, 1,1,2,2-tetrakis(4-hydroxyphenyl)ethane can be referred to.

Novolacs which belong to polyvalent phenol compounds can be obtained according to the known process which comprises reacting a bifunctional or tri- or higher-functional, mononuclear or polynuclear phenol compound is reacted, in the form of a single compound or a mixture of two or more compounds, with an aldehyde such as formaldehyde, paraformaldehyde, trioxane, acetaldehyde, benzaldehyde or the like or with an unsaturated alicyclic hydrocarbon such as dicyclopentadiene, cyclic terpene and the like or with methoxydimethylbenzene in the presence of an acid catalyst. As said bifunctional or tri- or higher-functional, mononuclear or polynuclear phenol compound, the following can be referred to: phenol, p-cresol, o-cresol, m-cresol, p-ethylphenol, p-propylphenol, p-tert-butylphenol, p-octylphenol, p-methoxyphenol, p-nonylphenol, 1-naphthol, 2-naphthol, 3,5-xylenol, resorcinol, catechol, Bisphenol A and Bisphenol F.

As epoxy resins other than the above, the following can be referred to: glycidylamines obtained by reacting epichlorohydrin with an amine having at least two amino-hydrogen atoms and then dehydrochlorinating the reaction product, such as N,N-diglycidylaniline, N,N-tetraglycidyl-4,4'-diaminodiphenylmethane, N-diglycidyl-4-amino-phenyl glycidyl ether and the like; heterocyclic epoxy resins obtained by reacting a heterocyclic compound with epichlorohydrin, such as triglycidyl isocyanurate, 5,5-dimethyl-N,N'-diglycidylhydantoin and the like; glycidyl esters of polybasic aromatic, aliphatic and alicyclic carboxylic acids, such as diglycidyl terephthalate, diglycidyl adipate, diglycidyl hexahydrophthalate, triglycidyl trimellitate, diglycidyl ester of dimenzed unsaturated fatty acid and the like; glycidylesters of (meth)acrylic acid and polyglycidylesters of (meth)acrylic acid polymers and copolymers, polyglycidyl ethers obtained by reacting a polyhydric alcohol-containing compound with epichlorohydrin under an alkaline condition or in the presence of a phase-transfer catalyst and an alkali or by reacting a polyhydric alcohol-containing compound in the presence of an acid catalyst and then treating the product with an alkali, such as butane-1,4-diglycidyl ether, hexane-1,6-diglycidyl ether, polypropylene glycol diglycidyl ether, trimethylolpropane glycidyl ether, 2,2-(bis(4-hydroxycyclohexyl)propane diglycidyl ether, diglycidyl ether obtained by reacting Bisphenol A with propylene oxide and then reacting the reaction product with epichlorohydrin, diglycidyl ether obtained by reacting Bisphenol A with butyl glycidyl ether and then reacting the reaction product with epichlorohydrin, glycidyl ether of polybutadiene having a terminal hydroxyl group; and the like. As examples of the epoxy resins which are not glycidyl compound, the following can be referred to: vinylcyclohexane diepoxide, dicyclopentadiene epoxide, alicyclic epoxy resins such as 3-(3',4'-epoxycyclohexyl)-8,9-epoxy-2,4-dioxaspiro[5.5]undecane, 3,4-epoxycyclohexylmethyl-3',4'-epoxycyclohexanecarboxylate, bis(3,4-epoxycyclohexyl)adipate and the like, and epoxidized polybutadiene.

Further, epoxy resins having an oxazolidone ring in the molecule thereof which are described in WO90/15089 can be referred to. The use of an epoxy resin having an oxazolidone ring makes it possible to improve the heat resistance of interlaminar insulating layer. Preferable epoxy resins having an oxazolidone ring and an epoxy group are reaction products between an epoxy resin having an epoxy equivalent of 170-210 g/mol such as Bisphenol A type epoxy resin, Bisphenol F type epoxy resin or 4,4',4"-methylidyne trisphenyl glycidyl ether and the like and a bifunctional isocyanate such as tolylene diisocyanate, hexamethylene diisocyanate, methylenediphenyl diisocyanate and the like.

Preferable epoxy resins are Bisphenol A type epoxy resin, Bisphenol F type epoxy resin, phenol novolac type epoxy resin, cresol novolac type epoxy resin, and epoxy resin having an oxazolidone ring in the molecule thereof. Preferable Bisphenol A type epoxy resin and Bisphenol F type epoxy resin have an epoxy equivalent of 175 to 3,000 g/mol. A further preferable epoxy resin is Bisphenol A type epoxy resin having an epoxy equivalent of 400 to 1,000 g/mol and a softening point of 40° C. to 100° C. A preferable novolac type epoxy resin has an epoxy equivalent of 175 to 230 g/mol, and a preferable oxozolidone ring-containing epoxy resin has an epoxy equivalent of 230 to 500 g/mol and an oxazolidone ring equivalent of 400 to 1,300 g/mol, and a softening point of 50° C. to 120° C. Preferably, these epoxy resins have a hydrolyzable chlorine content of 1,000 ppm or less. Preferably, these epoxy resins have an alpha(?)-glycol content of 100 mol/kg or less.

These epoxy resins may be used either alone or in combination of several species in accordance with the object of use. In the selection of combination of the epoxy resins, it is important to compound the epoxy resins so that the composition does not adhere to photomask at the time of exposure, and it is desirable that softening point of the composition is not higher than 100° C. so that the composition can be developed with a developing solution. When an epoxy resin having a softening point higher than 100° C. is used, it is possible to used in combination therewith a liquid (at normal temperature) Bisphenol A type epoxy resin having an epoxy equivalent of 175 to 210 g/mol in an amount of 2 to 15% by weight, for the purpose of realizing a desirable softening point. Preferably the softening point of the composition is not higher than 60° C.

As the modified phenolic resins having a triazine ring which can be used in the present invention, polycondensates formed between a phenol compound, a compound having a triazine ring and an aldehyde can be referred to. As the phenol compound, phenol, p-cresol, o-cresol, m-cresol, p-ethylphenol, p-propylphenol, p-tert-butylphenol, p-octylphenol, p-methoxyphenol, p-nonylphenol, 1-naphthol, 2-naphthol, 3,5-xylenol, resorcinol, catechol, Bisphenol A, Bisphenol F and the like can be referred to, which may be used alone or in combination of two or more. As the compound having a triazine ring, melamine and guanamines such as benzoguanamine, acetoguanamine and the like can be referred to, which may be used alone or in combination of two or more. As the aldehyde, formaldehyde, paraformaldehyde, trioxane, acetaldehyde, benzaldehyde and the like can be referred to.

Among the modified phenolic resins having a triazine ring, preferred are those having a phenolic hydroxyl equivalent of 120 to 300 g/mol, a softening point of 80° C. to 150° C. and a nitrogen content of 4 to 25% by weight, and further preferable are those having a phenolic hydroxyl equivalent of 150 to 250 g/mol, a softening point of 90° C. to 140° C. and a nitrogen content of 15 to 25% by weight. The triazine ring-containing modified phenolic resin is compounded with epoxy resin preferably in such an amount that the quantity of phenolic hydroxyl group of the triazine ring-containing modified phenolic resin comes to 0.2 to 0.8 equivalent per equivalent of the epoxy group in the epoxy resin, and further preferably in such an amount that the quantity of hydroxyl group of the triazine ring-containing modified phenolic resin comes to 0.2 to 0.5 equivalent per equivalent of the epoxy group in the epoxy resin.

Any latent basic curing agent for epoxy resins may be used for the purposes of the instant invention, for instance tertiary amine curing agents, in particular N,N,N',N'-tetramethyl-1,3-butane diamine, benzyldimethylamine, 2-dimethylamino-2-hydroxypropane, 2-(dimethylaminomethyl)phenol or 2,4,6-tris(dimethylaminoethyl)phenol, latent urea curing agents like, for instance, 2-chloro-4-(N,N'-dimethylureido)-toluene, 2-(N,N'-dimethylureido)phenol, 4-(N, N'dimethylureido)-chlorobenzene, and latent imidazole curing agents like the following imidazole compounds: 1-methylimidazole, 2-methylimidazole, 2-ethylimidazole, 2-undecylimidazole, 2-heptadecylimidazole, 1,2-dimethylimidazole, 2-ethyl-4-methylimidazole, 1-methyl-2-ethylimidazole, 2-phenylimidazole, 2-phenyl-4-ethylimidazole, 1-benzyl-2-phenylimidazole, 1-benzyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 2-phenyl-4,5-dihydroxymethylimidazole, 2-phenyl-4-methyl-5 hydroxymethylimidazole, 1-cyanoethyl-2-phenyl-4,5-di(2-cyanoethoxy)methylimidazole, and epoxy adducts formed between these imidazole compounds and epoxy resins.

As examples of the epoxy adduct, adduct between 2-methylimidazole and Bisphenol A type epoxy resin, adduct between 2-ethyl-4-methylimidazole and Bisphenol A type epoxy resin, adduct between 2-phenylimidazole and Bisphenol A type epoxy resin, adduct between 2-methylimidazole and cresyl glycidyl ether, adduct between 2-phenylimidazole and cresyl glycicyl ether, and the like can be referred to.

Said epoxy adduct contains at least one kind of imidazole compound preferably in an amount of 0.01 to 0.10 equivalent and further preferably in an amount of 0.015 to 0.04 equivalent per equivalent of the epoxy group of epoxy resin. Imidazole compounds like those mentioned beforehand are the preferred latent basic curing agents for the purposes of the invention. The term "latent" is used to clarify that only curing agents which do not render a hardening reaction possible at low temperatures are intended to be used for the instant invention. For use in accordance with the invention it is advantageous to use basic curing agents with which the hardening reaction only tajkes place at an elevated temperature, preferably above 80° C. and especially above 100° C.

As the photosensitive acid generator, those compounds which can be influenced by active energy beam can be used, and examples thereof include aryl diazonium salts; diaryliodonium salts such as diphenyliodonium tetrafluoroborate and the like; triarylsulfonium salts such as triphenylsulfonium hexafluoroantimonate and the like; arylacyl dialkylsulfonium salts; 1,2-quinonediazide calboxylic acid ester group; 1,2-quinonediazide sulfonic acid-4-ester group such as 4-trihydroxybenzophenone-1,2-naphthoquinonediazide-4-sulfonic acid ester, 4-(2-ethylhexanoyl)resorcinol-1,2-naphthoquinonediazide-4-sulfonic acid ester and the like and iron arene complex compounds. Among these photosensitive acid generators, preferable are iron arene complex compounds represented by the following formula:

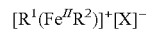

In this formula, $R^1$ represents π-arene and $R^2$ represents π-arene or π-arene anion. $R^1$ preferably represents $\eta^6$-cumene, $\eta^6$-naphthalene, $\eta^6$-benzene or $\eta^6$-pyrene. $R^2$ preferably represents an anion of $\eta^5$-cyclopentadiene. X represents a non-nucleophilic anion. Preferable examples of X include $BF_4^-$, $PF_6^-$, $AsF_6^-$, $SbF_6^-$, $SbF_5OH^-$; sulfonates such as methylsulfonate, p-toluenesulfonate and the like; perfluoroalkylsulfonates such as trifluoromethylsulfonate, nonafluorobutylsulfonate and the like; acetates such as $CH_3COO^-$ and the like; perfluoroacetates such as $CF_3COO^-$ and the like; halides such as F, $Cl^-$, $Br^-$, $I^-$ and the like; and pseudo-halides such as $CN^-$, $SCN^-$ and the like. Further preferably, X represents a sulfonate, a perfluorosulfonate or $PF_6^-$.

The composition contains at least one iron arene complex compound preferably in an amount of 0.2 to 1.4 equivalents and further preferably in an amount of 0.4 to 0.95 equivalent per equivalent of the imidazole compound.

The composition of the present invention can be divided into fluid A and fluid B with consideration of storage stability. The modes of the division are, for example, as follows: Fluid A=epoxy resin, Fluid B=triazine ring-containing modified phenolic resin, imidazole compound and photosensitive acid generator, Fluid A=epoxy resin and photosensitive acid generator, Fluid B=triazine ring-containing modified phenolic resin and imidazole compound. Preferably the fluid A and fluid B are mixed together just before the coating process.

In order to improve the follow-up property of the composition of the present invention to the conductor circuit pattern formed on the substrate and the leveling property thereof, the composition of the present invention may be diluted with a solvent to adjust its viscosity to a desired value. Organic solvents usable for this purpose include, for example, ketones such as acetone, methyl ethyl ketone, methyl isobutyl ketone, cyclohexanone and the like; aromatic hydrocarbons such as toluene, xylene and the like; cellosolves such as cellosolve, butyl cellosolve and the like; carbitols such as methyl carbitol, dimethyl carbitol, butyl carbitol and the like; carboxylic esters such as ethyl acetate, butyl acetate, cellosolve acetate, butyl cellosolve acetate, methoxypropyl acetate, carbitol acetate, butyl carbitol acetate, γ-butyrolactone and the like; alcohols such as butanol, methoxypropanol and the like; N-methyl-2-pyrrolidone, N,N-dimethylformamide, and dimethylacetamide. These solvents may be used alone or in the form of a mixture of two or more. Preferably, the composition which has been diluted with the solvent has a viscosity of 200 to 30,000 mPa·s.

If desired, the composition of the present invention may contain known additives in addition to the above. Examples of such additives include inorganic fillers such as barium sulfate, barium titanate, silicon oxide, talc, calcium carbonate, ammonium phosphate, mica, magnesium hydroxide, aluminum hydroxide and the like; organic fillers such as silicone powder, nylon powder, fluoride powder and the like; thixotropic agents such as Aerosil, Orben, benton, montrnorillonite and the like; colorants such as Phthalocyanine Blue, Phthalocyanine Green, Crystal Violet, titanium oxide and the like; antifoaming agents of silicone type and fluoride type; leveling agents such as silicone acryl and the like; silane coupling agents; adhesion improvers such as mercaptotetrazole and the like; anticoagulants for fillers; and antioxidants. In order to prevent the occurrence of a reaction at an excessively early stage due to unexpected irradiation, an ultraviolet absorber and/or a yellow- or red-colored organic dyes are added in small amounts. Some of the fillers, colorants and thixotropic agents are insoluble in organic solvent, and they may be any of globular ones, needle-like ones and amorphous ones are all usable, and the surface thereof may be treated with silane coupler or not treated. Preferably, the mean particle diameter is 10 μm or less and the quantity of filler added is 35% by weight or less. In a case where the composition contains a small amount of additive having a mean particle diameter greater than 10 μm, such great particles can advantageously be filtered off before the coating process onto the inner layer substrate. Preferably, the additives used for regulating the interface such as antifoaming agent, leveling agent and adhesion improver are used in an amount of 0.02 to 2% by weight.

Further, if desired, a sensitizer may be added for the purpose of enhancing photosensitivity. Examples of the sensitizer include anthracenes such as 9,10-diethoxyanthracene, 9-methylanthracene and the like; acetophenones such as acetophenone, dimethoxyphenyl-acetophenone and the like; and thioxanthones such as 2-isopropylthioxanthone, diethylthioxanthone and the like.

For compounding the above-mentioned additives into the composition of the present invention, the mixture is preliminarily kneaded with planetary mixer, homogenizer or the like and then the mixture is finely dispersed by means of triple roll mill, wet ball mill, wet beads mill or the like.

Further, in order to improve tenacity of the positive type photosensitive epoxy resin composition of the present invention, a known thermoplastic resin or a rubbery component may be used. As said thermoplastic resin, phenoxy resin, polytetrafluoroethylene, polyethylene terephthalate, polysulfone, polyphenylene sulfide, polyether sulfone, thermoplastic polyimide, polyphenylene ether, modified polyphenylene ether, polyethylene naphthalate, polyether ether ketone, polyvinyl butyral resin and the like can be used. As said rubbery component, polybutadiene rubber, acrylonitrile-butadiene rubber, carboxyl group-containing acrylonitrile-butadiene rubber, encapsulated polybutadiene rubber and the like can be used.

Further, if aqueous alkaline developabilty is desired, the epoxy composition according to the invention can contain an additional binder which is soluble in aqueous alkaline solutions, for example a polyphenol or a mixture of polyphenols, i.e. a polymer having a specific content of phenolic hydroxyl groups. The content should at least be sufficiently high to ensure development, or at least a swelling, in the aqueous alkaline solution of developer. Suitable film-forming binders, soluble in aqueous alkaline solutions include the following groups:
(i) novolaks formed from at least one phenol and at least one aldehyde,
(ii) homopolymers and copolymers of alkenylphenols and, in particular,
(iii) homopolymers and copolymers of N-hydroxyphenyl-maleinimides.

Such binders are described in more detail in U.S. Pat. No. 5,124,233, the disclosure of which is considered as being incorporated into the instant description.

It is as well possible to impart the instant epoxy compositions a developability in aqueous alkaline solutions by incorporating a sufficient amount of additives of low molecular weight to the epoxy composition which render the composition soluble or at least swellable in aqueous alkali, for instance monomeric phenolic compounds.

The compositions of the instant invention are useful for manufacturing insulating layers in particular for use in printed circuit board technology.

Accordingly the instant invention relates also to a method for forming an insulating layer characterized by coating a substrate with a positive type photosensitive epoxy resin composition comprising (a) an epoxy resin having two or more epoxy groups in one molecule, (b) a modified phenolic resin having a triazine ring, (c) an imidazole compound and (d) a photosensitive acid generator, followed by a step of preliminary drying at a temperature not higher than the temperature at which the subsequent heat curing step (I) is to be carried out, a step of imagewise irradiating the coating with an active energy beam, for instance through a photomask, a heat curing step (I), a step of dissolving and eliminating the exposed area, and an additional heat curing step (II).

Furthermore the instant invention relates to a printed circuit board comprising an insulating layer prepared with the aid of a positive type photosensitive epoxy resin composition as described above, in particular to a multilayered printed board of buildup mode which comprises at least one interlaminar insulating layer prepared with the aid of said positive type photosensitive epoxy resin composition Next, the method for preparing such a multilayered printed circuit board of buildup mode using the positive type photosensitive epoxy resin composition of the present invention will be mentioned as an example of using the epoxy compositions of the instant invention. At first, a positive type photosensitive epoxy resin composition of the present invention which has been diluted with an organic solvent is coated onto a single layer or multilayer type circuit substrate on which a pattern has previously been fabricated, up to a thickness not smaller than the thickness of conductor circuit, namely up to a thickness of 10-100 μm, under a yellow- or red-colored light Thereafter, the coated matter is preliminarily dried at 60° C. to 90° C. It is the object of the preliminary drying to prevent the photomask from adhesion to interlaminar insulating layer at the time of irradiation with active energy beam. By irradiating an active energy beam through a photomask, the photosensitive acid generator is activated and the imidazole compound is inactivated. Subsequently, the heat curing step (I) is practiced to cure the unexposed area. Then, the exposed area is dissolved and eliminated with a developer, for instance an organic solvent, the residue is rinsed, and then the heat curing step (II) is practiced to form a via-carrying insulating layer. Preferable condition of the heat curing step (I) is 95-120° C. for 30-120 minutes, and preferable condition of the heat curing step (II) is 130-200° C. for 30-480 minutes. In the multilayered circuit board of buildup mode using the composition of the present invention, a plurality of interlaminar insulating layers are formed in succession, due to which the layers are different from one another in heat history. For the purpose of lessening the differences in heat resistance, flexibility and adhesive property between the layers due to the difference in heat history, the heat curing step (II) may be divided into two sub-steps. For example, alt the layers are heat-cured and formed at 150° C. for 60 minutes, and thereafter all the layers are heat-cured at 180° C. for 240 minutes. The term "cure" herein used means a process of transformation during which a composition of the present invention which is originally soluble in a suitable solvent or fusible upon heating is transformed into an insoluble and infusible 3-dimensional crosslinked product through a process of heating.

In the next step, resin surface of interlaminar insulating layer and inner wall of via holes are subjected to a roughening treatment for the purpose of removing the scum from the bottom of via holes and improving the adhesion between copper plating layer and interlaminar insulating layer in the subsequent plating step. As the method for the roughening treatment, mechanical grinding methods such as buffing, sand blasting, jet scrubbing, etc.; plasma etching treatment; and chemical treatments using an oxidant such as potassium permanganate, sodium permanganate, potassium bichromate, ozone, hydrochloric acid, nitric acid, sulfuric acid-hydrofluoric acid, etc. can be used. In carrying out the roughening treatment of interlaminar insulating layer using an oxidant, the surface of the interlaminar insulating layer is preferably swollen with an organic solvent such as N-methyl-2-pyrrolidone, N,N-dimethylformamide, dimethylacetamide, dimethyl sulfoxide, methoxypropanol, -butyrolactone or the like prior to the treatment. Subsequently, a conductor layer is formed by electroless plating and/or electrolytic plating. Thickness of the electroless plating layer is 0.2 to 3 µm, and thickness of the electrolytic plating layer is 5 to 30 µm. After formation of the conductor layer, an annealing treatment is carried out at 130-200° C. for 10 to 60 minutes for the purpose of stabilizing the plating layer. A conductor circuit can be formed according to known method. For example, a photosensitive etching resist is applied onto the plating layer, the resist is exposed to light through a mask having a circuit pattern, and then development is carried out to form a pattern. The copper in the opening part of etching resist formed by development is etched with an acid to form a copper pattern. Then, the etching resist is peeled off to form a conductor circuit. Alternatively, after applying an electroless plating catalyst onto the interlaminar insulating layer, a plating resist having a pattern inverse to that of conductor layer is formed. If desired, a conductor circuit may be formed by electroless plating only.

By repeating the above-mentioned procedure several times, a multilayered printed circuit board in which a plurality of buildup layers are laminated can be obtained.

As the inner layer circuit substrate onto which the positive type photosensitive epoxy resin composition of the present invention is coated, epoxy substrate, polyester substrate, polyimide substrate, BT resin substrate, ceramic substrate, thermosetting PPE substrate and the like can be used. Although these inner layer circuit substrates may be made of a brominated resin, they are preferably made of non-brominated resin having a flame-retarding construction. As the reinforcing material, glass fiber, aramide fiber and the like are preferable. The surface of conductor is preferably subjected to a roughening treatment previously in order to improve the adhesion between the conductor surface and interlaminar insulating layer. As the method of roughening, a method of forming needle-like crystals on the conductor surface by an oxidation treatment (blackening treatment) and thereafter subjecting the excessively grown needle-like crystals to a reductive treatment, a method of micro-etching using a mixed solution of an organic acid and a cupric complex compound, a method of needle-like alloy plating using copper/nickel/phosphorus system, etc. can be referred to.

The irradiation of the positive type photosensitive resin composition of the present invention, namely the step of exposure, is preferably carried out by using radiation of a wavelength of 250 to 600 nm, and the quantity of energy is preferably 150 to 8,000 W. The light source which can be used are, for example, xenon lamp, argon lamp, tungsten lamp, carbon arc, metal halide and metal arc lamp (low pressure, medium pressure, high pressure and ultra-high pressure mercury lamps) or suitable lasers. Preferably, metal halide and metal arc lamp are used. After the irradiation, the composition is heat-cured by means of usual hot air circulating furnace. When a short time period of heating or a short time period of reaction is required, IR-irradiation, IR-laser or microwave apparatus may be used, if desired.

For coating the composition of the present invention, known methods such as spin coater method, roll coater method, screen coater method, die coater method, curtain coater method, spray coater method and the like can be used. The coating may be carried out multiple times for the purpose of obtaining a desired thickness of interlaminar insulating layer. In accordance with object which may be sometimes to smooth the surface or sometimes to fill up the via holes, other coating methods may be combined with the above-mentioned coating methods, and the coating may be carried out multiple times.

Examples of the solvents which can be used at the time of development include organic solvents like ketones such as methyl ethyl ketone, methyl isobutyl ketone, cyclohexanone and the like; cellosolves such as cellosolve, butyl cellosolve and the like; carbitols such as methyl carbitol, dimethyl carbitol, butyl carbitol and the like; carboxylic esters such as ethyl acetate, butyl acetate, cellosolve acetate, butyl cellosolve acetate, methoxypropyl acetate, carbitol acetate, butyl carbitol acetate, propylene carbonate, -butyrolactone and the like; alcohols such as butanol, methoxypropanol and the like; N-methyl-2-pyrrolidone, N,N-dimethylformamide, and dimethylacetamide, or usual aqueous alkaline developers. Mixtures of two ore more of these solvents are also usable.

The solvents which can be used for the rinsing include water; alcohols such as ethanol, isopropanol and the like; hydrocarbons such as hexane, cyclohexane and the like; and aromatics such as toluene, xylene and the like.

EXAMPLES

Next, the present invention is explained in more detail by referring to examples. The invention is by no means limited by these examples.

Table 1 illustrates details of the epoxy resin, triazine ring-containing modified phenolic resin, imidazole compound and photosensitive acid generator used in the Examples and the phenolic resin used in the Comparative Examples.

Table 2 illustrates Examples, and Table 3 illustrates Comparative Examples.

After preliminarily mixing the ingredients of Fluid A shown in Tables 2 and 3, the mixture was kneaded by means of wet beads mill and filtered by means of a 10 µm filter. The ingredients of Fluid B were heated to form a solution and then filtered by means of a 10 µm filter. Then, Fluid A and Fluid B were mixed together and used for the tests of Examples and Comparative Examples.

1) Heat Resistance Test

A mixture of Fluid A and Fluid B was coated by means of a curtain coater onto a non-brominated flame-retardant epoxy/glass substrate carrying a conductor circuit of 0.8 mm thick which had been subjected to a blackening-reduction treatment, so as to give a dry coating thickness, on conductor, of 30 µm. After drying the coat at 25° C. for 15 minutes under an air stream, the dried coat was further dried in a hot air circulating furnace at 80° C. for 15 minutes. After cooling the coated substrate, backside of the substrate was coated so as to give a dry coating thickness, on conductor, of 30 µm, dried under an air stream at 25° C. for 15 minutes and then dried in a hot air circulating furnace at 80° C. for 30 minutes. Then, ultraviolet ray having a wavelength of 365 nm was irradiated through a photomask at a dosage of 1,000 mJ/cm$^2$, after which the heat-curing step (I) was carried out at 105° C. for 60 minutes. After cooling the test piece to ambient temperature, (I) was carried out,—butyrolactone was sprayed for 1.5 minutes and then water was sprayed for 20 seconds. After development and rinsing, the heat-curing step (II) was carried out first at 150° C. for 60 minutes and then at 180° C. for 120° C.

The test piece was dipped in a solder bath at 260° C. for 10 seconds according to the testing method of JIS C6481, and then the test piece was examined for swelling and cracking.
- A: No change at all
- B: A slight change noticeable
- C: A marked change noticeable
- D: Swelling and cracking noticeable in the interlaminar insulating layer 2) Resolution Each of the compositions of Examples and Comparative Examples was coated onto a blackened and reduced substrate by means of a curtain coater so as to give a dry coating thickness of 50 µm, dried under an air stream at 25° C. for 15 minutes, and then dried in a hot air circulating furnace at 80° C. for 30 minutes. After cooling the coated matter to ambient temperature, ultraviolet ray having a wavelength of 365 nm was irradiated through a photomask at a dosage of 1,000 mJ/cm$^2$, and then the heat curing step (I) was carried out at 105° C. for 60 minutes. After cooling the test piece to ambient temperature,—butyrolactone was sprayed for 1.5 minutes and then water was sprayed for 20 seconds, after which development and rinsing were carried out. Then, the heat-curing step (II) was carried out first at 150° C. for 60 minutes and thereafter at 80° C. for 120 minutes to cure the test piece. Then, via hole formability at the opening part of photomask having a diameter of 70 µm was examined.
- A: Via hole having a diameter of 70 µm was formed, and development reached the bottom of via hole.
- B: Via hole having a diameter of 70-100 µm was formed, and development reached the bottom of via hole.
- C1: Via hole having a diameter of 40 µm or less was formed, and development did not reach the bottom of via hole.
- C2: Via hole having a diameter of 100 µm or above was formed, and the surface was tacky after development.
- D1: The exposed area also cured, and no via hole was formed.
- D2: After development, the unexposed area was also found to be developed.

3) Flame Retardance Test

Copper was etched off from both sides of a non-brominated flame-retardant epoxy/glass substrate having a thickness of 0.8 mm. Then the substrate was coated so as to give a dry coating thickness of 40 µm, and dried under an air stream at 25° C. for 15 minutes and then in a hot air circulating furnace at 80° C. for 15 minutes. After cooling the test piece to ambient temperature, the backside was coated so as to give a dry coating thickness of 40 µm, and dried under an air stream at 25° C. for 15 minutes and then in an hot air circulating furnace at 80° C. for 30 minutes. The above-mentioned procedure was again repeated, as a result of which the total thickness of dry coatings on one side came to 80 µm. Then, the heat-curing step (I) was carried out at 105° C. for 60 minutes, and thereafter the heat-curing step (II) was carried out first at 150° C. for 60 minutes and then at 180° C. for 120 minutes to cure the test piece.

Flammability of the test piece was examined and judged according to the description of Underwiters Laboratories: "Test for Flammability of Plastic Materials, UL-94".

4) Processability

A cold-rolled steel plate having a thickness of 0.8 mm which had been defatted with cyclohexanone and acetone was coated by means of a bar coater so as to give a dry coating thickness of 30 µm, dried under an air stream at 25° C. for 15 minutes, and then dried in a hot air circulating furnace at 80° C. for 30 minutes. Then, the heat-curing step (I) was carried out at 105° C. for 60 minutes, and the whole area was irradiated with an ultraviolet ray having a wavelength of 365 nm at a dosage of 1,500 mJ/cm$^2$. Then, the heat-curing step (II) was carried out first at 150° C. for 60 minutes and thereafter at 180° C. for 120 minutes to cure the test piece. Elongation of the test piece was measured by means of Erichsen tester.

[Effect of the Invention]

According to the method of the present invention, a multilayered printed circuit board of buildup mode superior in resolution, heat resistance, flexibility and electrical insulating property and capable of exhibiting a flame retardance without using any of brominated resin and antimony compound can be obtained in a high productivity.

TABLE 1

| | |
|---|---|
| Epoxy resin A | Liquid Bisphenol A type epoxy resin |
| | Epoxy eq. = 189 g/mol, Viscosity = 13,000 mPa · s (25° C.), Total chlorine content = 1,200 ppm |
| Epoxy resin B | Bisphenol A type epoxy resin |
| | Epoxy eq. = 460 g/mol, Softening point = 68° C., Total chlorine content = 1,200 ppm |
| Epoxy resin C | Bisphenol A type epoxy resin |
| | Epoxy eq. = 760 g/mol, Softening point = 94° C., Total chlorine content = 1,100 ppm |
| Epoxy resin D | Oxazolidone ring-containing Bisphenol A type epoxy resin |
| | Epoxy eq. = 340 g/mol, Softening pt. = 78° C., Total chlorine content = 1,000 ppm, Oxazolidone ring content eq. = 630 g/mol |
| Epoxy resin F | Phenol novolac type epoxy resin |
| | Epoxy eq. = 178 g/mol, Viscosity = 45,000 mPa · s (52° C.), Total chlorine content = 1,600 ppm |
| Triazine ring-containing modified phenolic resin | Formaldehyde/phenol/benzoguanamine Hydroxyl eq. = 230 g/mol, Softening pt. = 105° C., Nitrogen content = 20% |
| Phenolic resin | Formaldehyde/phenol Hydroxyl eq. = 105 g/mol, Softening pt. = 98° C. |
| Imidazole compound A | 2-Ethyl-4-methylimidazole |
| Imidazole compound B | 2-Phenylimidazole |
| Iron allene complex compound A | ($\eta^6$-Cumene) ($\eta^5$-cyclopentadiene)Fe-hexafluorophosphate |
| Iron allene complex compound B | ($\eta^6$-Cumene) ($\eta^5$-cyclopentadiene)Fe-trifluoromethylsulfonate |

TABLE 2

|  | Ex. 1 | Ex. 2 | Ex. 4 | Ex. 5 | Ex. 6 | Ex. 7 |
|---|---|---|---|---|---|---|
| Fluid A |  |  |  |  |  |  |
| Epoxy resin A |  |  |  |  | 5.4 | 5.4 |
| Epoxy resin B |  |  |  |  | 10.8 | 10.8 |
| Epoxy resin C | 43.5 | 43.5 | 43.5 | 43.5 |  |  |
| Epoxy resin D |  |  |  |  | 37.9 | 37.9 |
| Epoxy resin E | 10.9 | 10.9 | 10.9 | 10.9 |  |  |
| Methylmercaptotetrazole | 0.1 | 0.1 | 0.1 | 0.1 | 0.1 | 0.1 |
| Polyether-modified dimethylsiloxane | 0.2 | 0.2 | 0.2 | 0.2 | 0.2 | 0.2 |
| Polymethylalkylsiloxane | 0.2 | 0.2 | 0.2 | 0.2 | 0.2 | 0.2 |
| Aerosil R-972 | 1.7 | 1.7 | 1.7 | 1.7 | 1.7 | 1.7 |
| Magnesium hydroxide | 12.0 | 12.0 |  | 12.0 | 12.0 |  |
| Iron allene complex compound A | 1.1 | 1.1 | 1.1 |  |  |  |
| Iron allene complex compound B |  |  |  | 1.2 | 2.0 | 2.0 |
| Diethylthioxanthone | 0.5 | 0.5 | 0.5 | 0.5 | 0.5 | 0.5 |
| Methoxypropyl acetate | 42.0 | 42.0 | 42.0 | 42.0 | 42.0 | 42.0 |
| Fluid B |  |  |  |  |  |  |
| Phenolic resin |  |  |  |  |  |  |
| Triazine ring-containing modified phenolic resin | 12.9 | 12.9 | 12.9 | 12.9 | 17.9 | 17.9 |
| Imidazole compound A | 0.3 |  |  |  |  |  |
| Imidazole compound B |  | 0.4 | 0.4 | 0.4 | 0.6 | 0.6 |
| Methoxypropyl acetate | 16.0 | 16.0 | 16.0 | 16.0 | 16.0 | 16.0 |
| Heat resistance | A | A | A | A | A | A |
| Resolution | B | B | A | B | B | A |
| Flame retardance | V-1 | V-1 | V-1 | V-1 | V-0 | V-1 |
| Flexibility (mm) | 6 | 6 | 6 | 6 | 7 | 7 |

Methylmercaptotetrazole: Adhesion improver
Polyether-modified polydimethylsiloxane: Leveling agent
Polymethylalkylsiloxane: Antifoaming agent
Aerosil R-972: Thixotropic agent
Magnesium hydroxide: Inorganic filler

TABLE 3

|  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|
| Fluid A |  |  |  |  |  |  |
| Epoxy resin A |  |  |  |  |  |  |
| Epoxy resin B |  |  |  |  |  |  |
| Epoxy resin C | 43.5 | 43.5 | 43.5 | 43.5 | 43.5 | 43.5 |
| Epoxy resin D |  |  |  |  |  |  |
| Epoxy resin E | 10.9 | 10.9 | 10.9 | 10.9 | 10.9 | 10.9 |
| Methylmercaptotetrazole | 0.1 | 0.1 | 0.1 | 0.1 | 0.1 | 0.1 |
| Polyether-modified dimethylsiloxane | 0.2 | 0.2 | 0.2 | 0.2 | 0.2 | 0.2 |
| Polymethylalkylsiloxane | 0.2 | 0.2 | 0.2 | 0.2 | 0.2 | 0.2 |
| Aerosil R-972 | 1.7 | 1.7 | 1.7 | 1.7 | 1.7 | 1.7 |
| Magnesium hydroxide | 12.0 | 12.0 | 12.0 | 12.0 | 12.0 | 12.0 |
| Iron allene complex compound A | 1.1 | 1.1 | 1.1 | 1.1 | 0.1 | 2.3 |
| Iron allene complex compound B |  |  |  |  |  |  |
| Diethylthioxanthone | 0.5 | 0.5 | 0.5 | 0.5 | 0.5 | 0.5 |
| Methoxypropyl acetate | 42.0 | 42.0 | 42.0 | 42.0 | 42.0 | 42.0 |
| Fluid B |  |  |  |  |  |  |
| Phenolic resin |  | 10.6 |  |  |  |  |
| Triazine ring-containing modified phenolic resin |  |  | 12.9 | 12.9 | 12.9 | 12.9 |
| Imidazole compound A |  |  |  |  |  |  |
| Imidazole compound B | 0.4 | 0.4 | 0.1 | 2.6 | 0.4 | 0.4 |
| Methoxypropyl acetate | 16.0 | 16.0 | 16.0 | 16.0 | 16.0 | 16.0 |
| Heat resistance | A | A | B | D | B | C |
| Resolution | B | B | D2 | D1 | C1 | C2 |
| Flame retardance | Flam. | Flam. | V-1 | V-1 | V-1 | V-1 |
| Flexibility (mm) | 6 | 2 | 4 | 1> | 6 | 2 |

Com.Ex. = Comparative Example
Flam. = Flammable
Methylmercaptotetrazole: Adhesion improver
Polyether-modified polydimethylsiloxane: Leveling agent
Polymethylalkylsiloxane: Antifoaming agent
Aerosil R-972: Thixotropic agent
Magnesium hydroxide: Inorganic filler

What is claimed is:

1. A process of preparing a multilayered printed circuit board of buildup mode comprising the steps of:
   (i) coating onto a circuit substrate, on which a pattern has previously been fabricated, an insulating layer comprising a positive type photosensitive epoxy resin composition wherein the positive type photosensitive epoxy resin composition comprises (a) an epoxy resin having two or more epoxy groups in one molecule; (b) a modified phenolic resin having a triazine ring, (c) a latent basic curing agent, and (d) a photosensitive acid generator;
   (ii) drying the insulating layer at a temperature between about 60°-90° C.;
   (iii) irradiating the insulating layer imagewise with an active energy beam through a photomask;
   (iv) heat curing the insulating layer at a first temperature of between 95°-120° C. to cure unexposed areas;
   (v) dissolving exposed areas with a developer;
   (vi) additionally heat curing the insulating layer at a second temperature of between 130°-200° C.;
   (vii) subjecting the insulating layer to a roughening treatment;
   (viii) forming a conductor layer by electroless plating and/or electrolytic plating;
   (ix) adhering the conductor layer to the insulating layer;
   (x) coating onto the conductor layer another insulating layer comprising the positive type photosensitive epoxy composition; and
   (xi) repeating steps (ii) to (x) as necessary to produce the multilayer printed circuit board.

2. The process of claim 1 wherein the positive type photosensitive epoxy composition is diluted with an organic solvent.

3. The process of claim 1 wherein the developer is selected from the group consisting of methyl ethyl ketone, methyl isobutyl ketone, cyclohexanone, cellosolve, butyl cellosolve, methyl carbitol, dimethyl carbitol, butyl carbitol, ethyl acetate, butyl acetate, cellosolve acetate, butyl cellosolve acetate, methoxypropyl acetate, carbitol acetate, butyl carbitol acetate, butanol, methoxypropanol, N-methyl-2-pyrrolidone, N,N-dimethylformamide, dimethylacetamide and mixtures thereof.

* * * * *